United States Patent [19]  [11] 3,935,529
Kalmanash et al.  [45] Jan. 27, 1976

[54] MODULATED ENERGY CONSERVATIVE CURRENT SUPPLY

[75] Inventors: Michael H. Kalmanash, Bethel; Glenn C. Waehner, Riverside, both of Conn.

[73] Assignee: United Technologies Corporation, Hartford, Conn.

[22] Filed: Oct. 9, 1974

[21] Appl. No.: 513,359

[52] U.S. Cl. ............... 323/4; 307/52; 315/387; 315/411; 323/DIG. 1
[51] Int. Cl.² ........................................ G05F 1/62
[58] Field of Search ............ 323/1, 4, 9, 17, DIG. 1, 323/23, 25, 22 T; 307/43, 52, 54, 126; 315/387, 389, 399, 403, 407, 411; 317/DIG. 4

[56] References Cited
UNITED STATES PATENTS

| | | | |
|---|---|---|---|
| 3,237,008 | 2/1966 | Karp et al. | 323/22 T |
| 3,404,310 | 10/1968 | Williams | 315/389 |
| 3,426,245 | 2/1969 | Yurasek et al. | 315/389 |
| 3,562,623 | 2/1971 | Farnsworth | 323/DIG. 1 |
| 3,600,666 | 8/1971 | Gliever | 323/DIG. 1 |
| 3,621,372 | 11/1971 | Paine | 323/DIG. 1 |
| 3,628,083 | 12/1971 | Holmes | 315/387 |
| 3,787,730 | 1/1974 | Ray et al. | 323/25 |
| 3,818,306 | 6/1974 | Marini | 323/DIG. 1 |
| 3,818,318 | 6/1974 | Schott et al. | 323/17 |
| 3,835,368 | 9/1974 | Williams | 323/DIG. 1 |
| 3,849,665 | 11/1974 | Wells | 323/22 T |

Primary Examiner—Gerald Goldberg
Attorney, Agent, or Firm—M. P. Williams

[57] ABSTRACT

A regulated current source including a large inductance provides desired, average DC current by modulation of an electron switch, such that the inductance is disconnected from the power supply on a regular basis by a clock circuit, and the switch reconnects the power supply when the current in a return path to the inductor has decayed to a desired magnitude. The desired decay current across a resistor is compared with a reference which turns the switch on in the absence of the turn-off signal from a clock. As an energy saving adjunct in a deflection amplifier system for a CRT, a bipolar embodiment employing a single large inductance and duplicate other apparatus provides a regulated current of either polarity or zero magnitude, the inductor current being maintained even when providing zero current with the deflection system.

5 Claims, 4 Drawing Figures

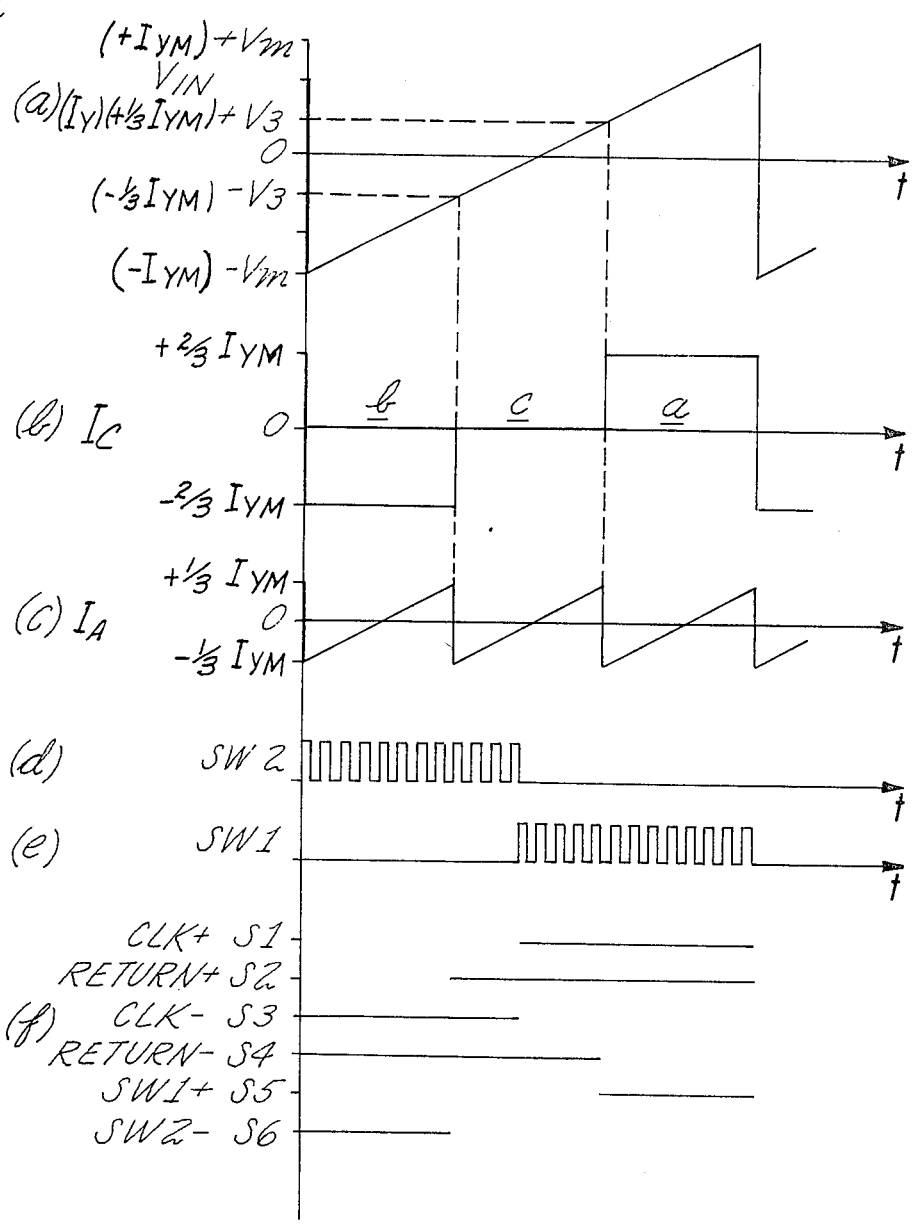

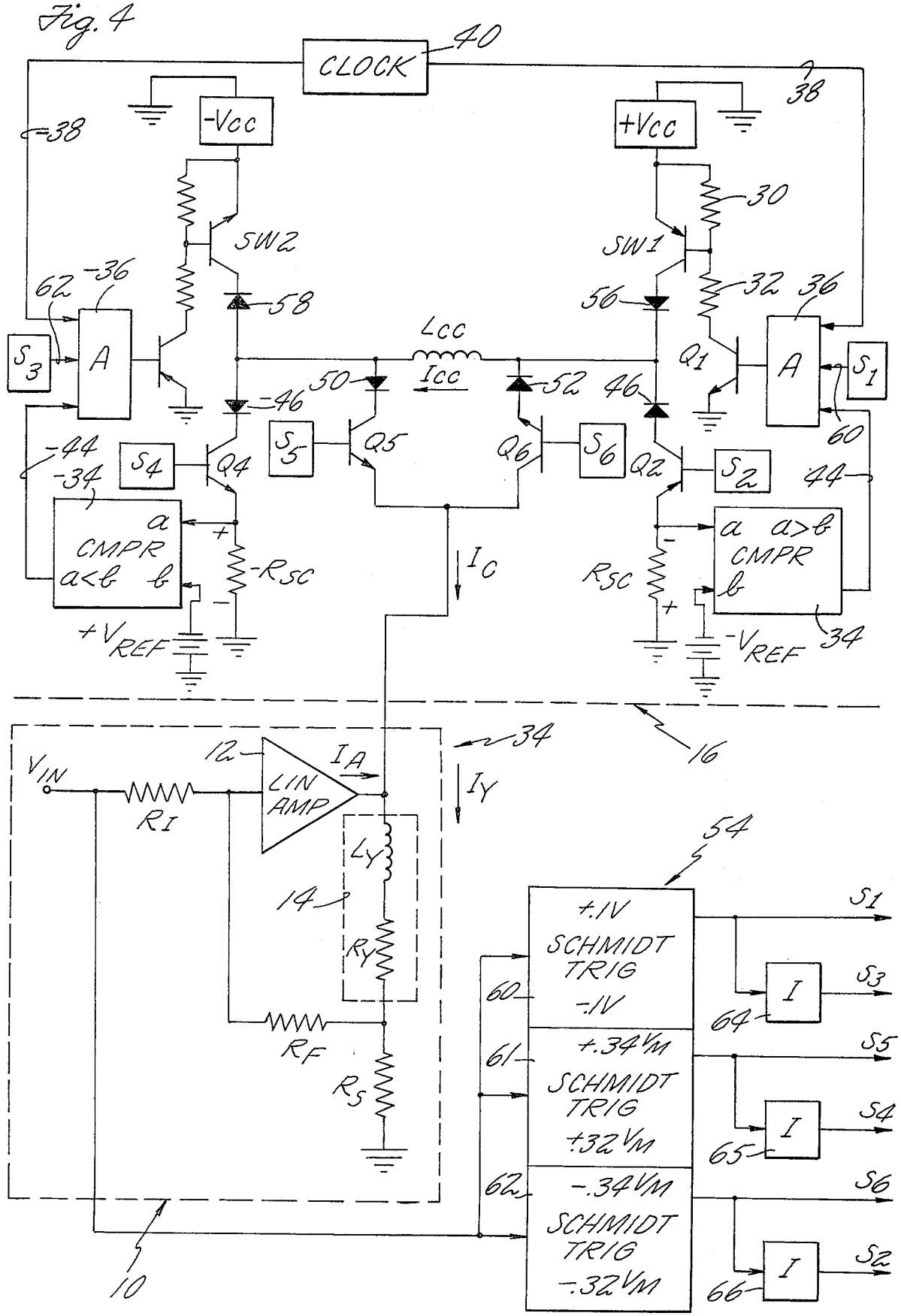

MODULATED ENERGY CONSERVATIVE CURRENT SUPPLY

BACKGROUND OF THE INVENTION

1. Field of Invention

This invention relates to energy conservative current supplies, and more particularly to energy conservative current sources adapted for rapid response to variable demand.

2. Description of the Prior Art

The use of magnetic deflection in cathode ray display systems of many types is well known. One reason for preferring magnetic deflection is the superior brightness and resolution characteristics which may be obtained. However, magnetic deflection systems consume considerably more power than do electrostatic systems. The current provided to a deflecting yoke associated with a CRT must normally vary from some negative value (for deflection to one edge of the screen), through zero (for deflection at the center of the screen) to a high positive value (for deflection at the opposite edge of the screen). Since the deflection must be in accordance with the desired picture, it must be provided by a linear amplifier working with suitable positive and negative voltage supplies. If deflection is to change extremely rapidly, then the power supplies must additionally be of relatively high voltage. But when the rate of change of current to the yoke is relatively low, then the driving voltage must be relatively low. The output amplifier for driving a yoke must therefore drop considerable voltage over a considerable portion of the time while supplying substantial current. This is what consumes the power. In a resonant display (such as a TV or other raster-type system) the energy is circulated in reactive elements and conserved. But in other displays (such as stroke-written displays), this is not possible.

To conserve energy in non-resonant displays, the use of energy-conservative, modulated power supplies is known. These conserve energy by duty-cycle modulation of a current supplied to the load. Such power supplies are either full-on or full-off. When full-on, they are like a switch which is closed and makes a low resistance connection, so that the passage of a large current therethrough does not dissipate much power. When they are full-off, there is no current flow so there can be no power dissipation. By causing the power supply to be on for the correct percentage of the time, at a fairly high switching rate or frequency, the average current can be controlled with relatively small power losses within the power supply itself. However, devices of this type have not been provided with adequate control (in terms of a faithful, linear current representation of an input control signal) for high quality CRT display systems.

SUMMARY OF THE INVENTION

An object of the present invention is to provide an improved energy conservative current source.

Another object of the invention is to provide improved energy conservative magnetic deflection systems for use with CRT displays.

According to the present invention, a modulated, energy conservative current source comprises a large inductance and an electronic switch for cyclically connecting the inductance to a power supply, the duty cycle being regulated to control the average current through the large inductance. In accordance with the present invention, when the inductance is not being fed by the power supply, voltage developed across a resistor in a current return path is compared against a reference, and when the current has decayed to a desired value, the switch is again closed so that the power supply will feed the inductance.

Accordance to the invention, an energy conservative current supply includes a source of substantially constant current which is connected to a load in either of two polarities (or disconnected) in dependence upon whether the load current is to be positive or negative (or less than half of the source), respectively, the same source providing the constantly-maintained current to the load regardless of the polarity. The current from the modulated energy conservative current module is added with the current of a feedback amplifier system in dependence upon input voltages so as to provide carefully regulated total current required to drive the load in accordance with the input voltages.

The present invention is readily implemented with known technology utilizing components which are commonly available in the market. The invention may be utilized as an add-on adjunct to existing current amplifiers for magnetic deflection yokes. The invention provides the bulk of the normally energy-dissipative current in a nondissipative fashion, saving on the order of two thirds of the energy consumption in contrast with nonconservative linear current amplifiers commonly used to drive deflection yokes. The invention permits an increase in bandwidth in the linear, feedback-controlled amplifier that responds to input signals to provide the desired yoke current inasmuch as power dissipation in such amplifier is less of a design consideration. By adding current to the current supplied from a controlled amplifier connected in a feedback loop, the controlled amplifier will provide necessary current so that the total yoke current is precisely that commanded by a deflection input signal.

Other objects, features and advantages of the present invention will become more apparent in the light of the following detailed description of preferred embodiments thereof, as illustrated in the accompanying drawing.

BRIEF DESCRIPTION OF THE DRAWING

FIG. 2 comprises a plurality of illustrations of the operation of the present invention, on a common time base;

FIG. 4 is a schematic diagram of a bipolar current source in accordance with another aspect of the present invention, illustrated in conjunction with a magnetic deflection system.

DESCRIPTION OF THE PREFERRED EMBODIMENTS

Figure 1:
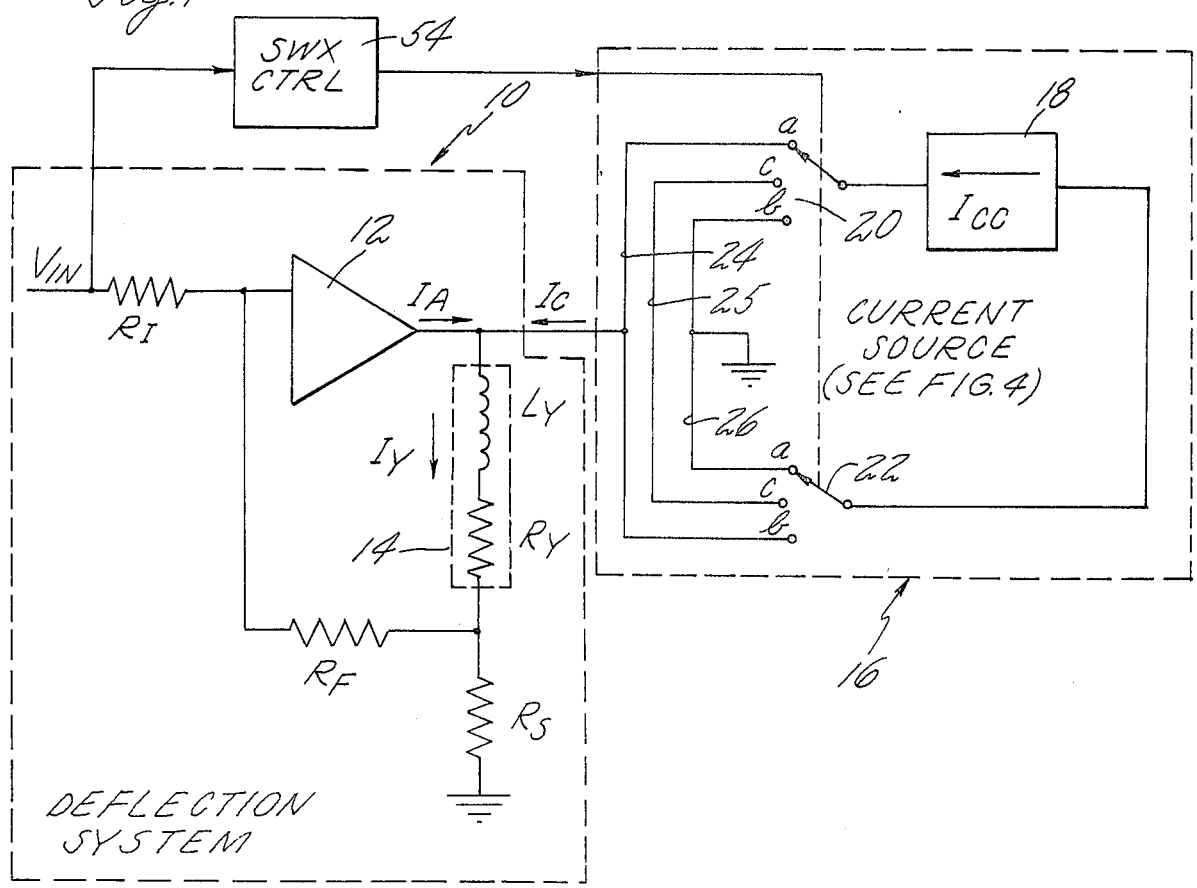
FIG. 1 is a simplified schematic illustration of the concept of one aspect of the present invention.

Referring now to FIG. 1, a magnetic deflection system 10, of the type generally known in the art, includes a linear amplifier 12 which provides a current to the yoke 14 of a cathode ray tube, which includes an inductance $L_Y$ and a small resistance $R_Y$. The yoke current is also passed through a sensing resistor $R_S$. A feedback resistor $R_F$ is connected to the input of the amplifier 12 from the junction of the yoke with the sensing resistor, where it forms a junction with an input resistor $R_I$. The current through the yoke 14 will be whatever is required in order to cause the voltage developed across the sensing resistor $R_S$ (or other feedback) to exactly balance the deflection command input voltage $V_{IN}$, as is known in the art. In the deflection system 10 just described, the yoke current $I_Y$ and the amplifier output current $I_A$ are the same. Although the resistance $R_Y$ of the yoke 14 is quite small, so that the current $I_Y$ therethrough does not result in very much power dissipation, the required rate of change of position and therefore of current in the yoke may necessitate high voltages in the amplifier 12. And the angle of the sweep (the included angle within which the beam of the CRT may be required to sweep) may require high currents of the amplifier 12. However, the voltage for a given current through the yoke may be quite small so that a high voltage drop within the amplifier may be required at times when there is a high current being delivered by the amplifier. This is where large power dissipation occurs. In addition, this causes the amplifier to be designed for power dissipation, at the cost of bandwidth design.

The foregoing problems are overcome in accordance with a first aspect of the present invention by means of a modulated, energy-conservative module or current source 16 which supplies in additional current, $I_C$, to the yoke 14, thereby reducing current requirements of the amplifier 12. This is illustrated conceptually in FIG. 1 to include a substantially constant current source 18, a pair of three-position switches 20, 22 conductors 24–26, and switch controls 54 (described with respect to FIG. 4 hereinafter). With the switches 20, 22 in the position (a) shown, the current $I_{CC}$ of the source 18 flows (in the positive current sense) into the conductor 24, to the yoke 14, through ground and the conductor 26, through the switch 22 and back to the current source 18. This then provides a positive current ($I_Y$ downwardly as seen in FIG. 1) to the yoke 14. On the other hand, if the switches 20, 22 are put to their middle position (c), then the current of the source 18 would simply circulate through the conductor 25 and provided no current at all to the deflection system 10. When the switches 20, 22 are put to the lowermost position (b), then current will flow from the source 18 through the switch 20 to ground over the conductor 26, upwardly through the yoke 14 and back through the conductor 24 and switch 22 to the source 18, thereby providing a negative current ($I_Y$ flowing upwardly in FIG. 1) through the yoke 14.

The effect of the apparatus of FIG. 1 is shown in illustrations (a) through (c) of FIG. 2. Illustration (a) of FIG. 2 is in terms of input voltage $V_{IN}$ vs. time ($t$), but as indicated parenthetically, is equally useful as an illustration of desired yoke current $I_Y$. As shown in illustration (b) of FIG. 2, if the current $I_C$ supplied by the module 16 is regulated with respect to the desired yoke current (illustration (a)), such that $I_C$ is either two thirds of the maximum deflection current ($I_{YM}$) or zero current, then the amplifier 12 need provide a current $I_A$ which is never more than one third of the maximum as shown in illustration (c) which represents the difference between illustrations (a) and (b). If the current steps of illustration (b) are in fact regulated with respect to the desired yoke current as indicated by the input voltage $V_{IN}$ (illustration (a)), the current $I_A$ of the amplifier 12 can either aid or oppose that current due to the feedback taken from the sensing resistor $R_S$. Hence, when maximum negative deflection current is desired (left of FIG. 2) a negative amplifier current must be added to the negative current source current so as to equal maximum negative current. However, when the input voltage (illustration a) reduces to a voltage indicating only two thirds the maximum current, since this can all be supplied by $I_C$ the amplifier current $I_A$ becomes zero. In other words, assuming that the switches 20, 22 are adjusted to their positions (b), (c) or (a) in dependence upon maximum negative, near zero, maximum positive input voltages, then commensurate aiding, opposing or total currents can be provided by the amplifier, with the maximum amplifier current reduced by two thirds, therefore making nearly a two thirds reduction in power dissipation possible. This is so because, as illustrated more fully hereinafter, the power dissipated in a current source according to the present invention is independent of the power supply voltage therein, and amounts only to some small resistive losses and losses across saturated transistors and diodes.

Figure 3:
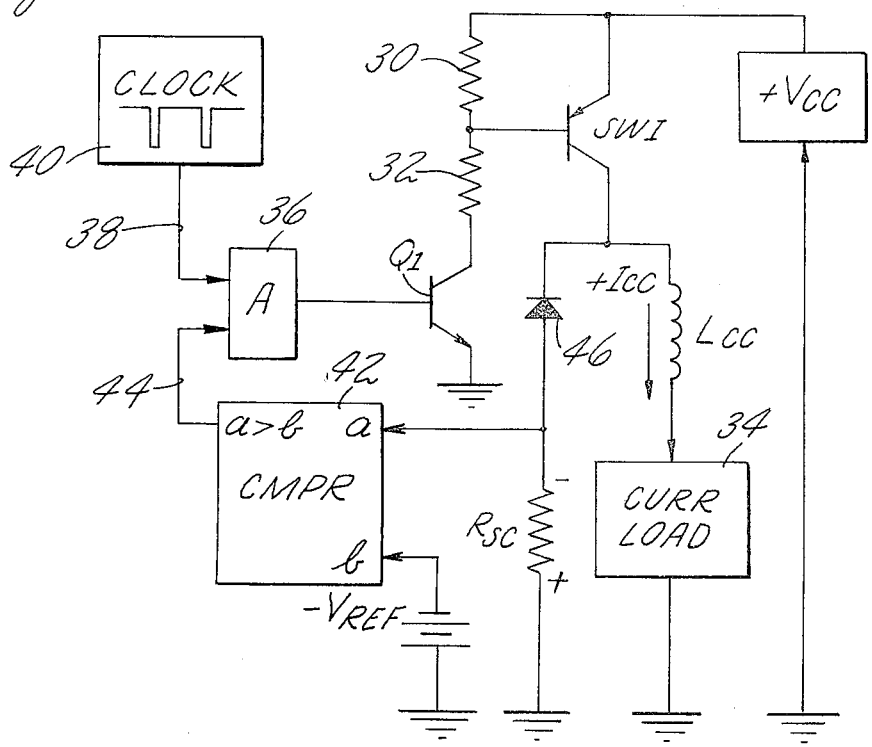
FIG. 3 is a schematic diagram of a unipolar, modulated, energy conservative regulated current source in accordance with one aspect of the invention.

In accordance with another aspect of the present invention, a current regulated source (of the type useful in implementing the scheme illustrated with respect to FIG. 1) is shown in FIG. 3. The key elements to this circuit are a large inductance $L_{CC}$ which is selectively connected to a power supply $+V_{CC}$ by an electronic switch SW1, which may for instance be a PNP transistor, such as a 2N3792. This transistor is caused to turn on by virtue of an NPN transistor $Q_1$ conducting so that the current flow from $+V_{CC}$ through a resistor divider 30, 32 will cause the base of SW1 to become more negative than the emitter thereof, so that it saturates in conduction. Then current $+I_{CC}$ flows downwardly (as seen in FIG. 3) through the inductor $L_{CC}$ and through a current load 34 (which could for instance comprise a deflection amplifier, a magnetic memory, or other current utilization device) to ground, and to the negative side of the power supply $+V_{CC}$. However, the transistor $Q_1$ will conduct only as long as it receives a signal from an AND circuit 36 which in turn is responsive to cyclic commutation signals on a line 38 provided by a clock 40, as well as to the output of a comparator circuit 42 on a line 44. The commutating signals on the line 38 are normally of a polarity for a logical one so that the AND circuit 36 can operate; but on a cyclical basis, these signals become logical zeros just for a sufficient time to be sure that the switch $Q_1$ will turn completely off. With switch $Q_1$ off, no current flows through resistors 30, 32 so that the base and emitter of SW1 are at the same potential and it shuts off as well. However, as is known, the current in an inductor tends to maintain itself, so that this current now flows upwardly through a unilaterally conducting decay current path comprised of a sensing resistor $R_{SC}$ and a diode 46 (preferably a high current, low voltage-diode for minimum power consumption). The inductance of the inductor $L_{CC}$ is very large so that the current through it is very nearly constant, thus the current in the loop (including the inductor, the current load 34, the sense resistor $R_{SC}$ and the diode 46) will decay very slowly. This current produces a voltage drop, negative at the top of $R_{SC}$ as seen in FIG. 3, which is applied to one input of the comparator 42. A negative reference potential $V_{REF}$ is applied to the other input of the comparator 42, and when the voltage across the sensing resistor $R_{SC}$ is greater than (less negative) the reference voltage, an output is provided on the line 44 to enable the AND circuit 36 to turn on the transistor $Q_1$, so that it will turn on the switch SW1. Once the switch SW1 is turned on, the junction of the switch, the inductor $L_{CC}$, and the diode 46 is very highly positive, so that the diode 46 is reverse biased, and there is no current flow through the sense resistor $R_{SC}$ so that the related input of the comparator goes to essentially ground potential. Thus it is always more positive than the reference input to the comparator with no current flow through it, so that the comparator continues to provide the output on the line 44. This condition continues in the comparator until such time as there is a high current flow through the sense resistor as a result of the initial turning off of the switch SW1, which presents a large current through the sense resistor $R_{SC}$ until that current decays to a point where the voltage at its upper end is again less than the negative reference potential at the other input of the comparator.

Of course, the comparator, the reference voltage, and the sensing resistor $R_{SC}$ provide but one way to establish a signal on a line 44 in response to current being less than a given magnitude (the magnitude which develops a voltage commensurate with the reference voltage $-V_{REF}$). For instance, if desired, any form of current level sensor may be utilized to provide a signal on the line 44 whenever the current to the diode 46 is less than some determinable amount. This then would include, in the embodiment of FIG. 3, the case where no current flows through the diode 46, which is true whenever the switch SW1 is conducting.

The regulated current source in FIG. 3 is energy conservative because of the fact that the power supply $+V_{CC}$ is only connected when the switch SW1 is in full conduction, and the power supply voltage $+V_{CC}$ appears across the switch SW1 only when the switch is open with no current flow through it. Thus only forward saturation voltage drops across the transistors and diodes, and small IR drops across the sense resistor, and convetional circuit power consumption in the comparator, the AND circuit and the clock 40 are consumptive of power in the circuit of FIG. 3. Assuming a 50 percent duty cycle, the average power dissipated in the circuit of FIG. 3 is independent of the power supply voltage $+V_{CC}$, and is given by:

$$P_{CC} = \frac{1}{2} I_{CC} V_{SW_1} + \frac{1}{2}(I_{CC} V_{46} + R_{SC} I_{CC}^2) + I_{CC}^2 R_{CC}$$

where $V_{SW1}$ is the saturation voltage drop of the transistor SW1, $V_{46}$ is the forward bias drop across the diode 46, and $R_{CC}$ is the resistance of the large inductance $L_{CC}$. This power dissipation is much smaller than occurs with a linear current regulator which works with a voltage $V_{CC}$ and must supply a maximum current of $I_{CC}$, which power (in a bipolar linear amplifier) is about a fourth of the product of the voltage of the power supply times the maximum current in either direction, since that is the average power which must be dissipated by both supplies.

A current source of the type described with respect to FIG. 3, adapted for use as in the illustration of FIG. 1, is shown in FIG. 4. Therein, insofar as the positive current portion is concerned, common elements bear the same designations and reference numerals in FIG. 4 as they do in FIG. 3. The circuit of FIG. 3 provides current at all times to the load 34. In order to adapt it for use as illustrated in FIG. 1, it is necessary to be able to turn it on and off and to regulate the polarity thereof. In FIG. 4, virtually all of the circuitry of FIG. 3 is duplicated with the exception of the large inductance $L_{CC}$ which is common to the positive half (to the right in FIG. 4, equivalent to FIG. 3) and a negative half (to the left in FIG. 4) which is similar to that of FIG. 3 but operating in the opposite polarity with respect to a negative power supply $-V_{CC}$. Since the negative side is fully commensurate with the positive side, the circuit of FIG. 4 is described with respect to the positive side, insofar as is appropriate. The deflection system 10 (of FIG. 1) is shown in the bottom of FIG. 4 to comprise the current load 34 (of FIG. 3). When the current through the yoke 14 is between plus and minus one third of the maximum desired yoke current ($I_{YM}$), as illustrated by switch position (c) in FIG. 1 and the central portion of FIG. 2, no current $I_C$ is to be supplied by the energy conservation module 16 FIG. 1, top of FIG. 4), and to achieve this, a pair of transistors $Q_5$, $Q_6$ and related isolation diodes 50, 52 have been provided so as to be able to shut off the current from the conservative module 16. The turn-on and turn-off of $Q_5$ and $Q_6$ is in response to signals $S_5$ and $S_6$ which are developed in a control signal generator 54 (bottom of FIG. 4) which is described more fully hereinafter. On the other hand, when it is desired to supply current from the module 16 to the deflection system 10, it is necessary to prevent current flow through the sensing resistor of the related main switch (that is, to prevent flow through $-R_{SC}$ when the switch SW1 is conducting) and therefore, additional transistors $Q_2$, $Q_4$ are provided in series with the sensing resistors to open up the decay current path when the related main switch (SW1, –SW2, respectively) is not providing current $I_C$ to the deflection system 10. but even though neither of the current generators is providing current to the deflection system 10, it is necessary to maintain the regulator current through the large inductance $L_{CC}$, so signals controlling the transistors $Q_2$, $Q_4$ are such as to permit the opposite one to provide a return to ground for whichever one of the main switches is supplying the current to the large inductor $L_{CC}$, whenever the current through the inductor $L_{CC}$ is not provided as $I_C$ to the deflection system 10. This is under control of signals $S_2$ and $S_4$ which are provided by the control signal generator 54. Additionally, each of the main switches has an additional rectifier 56, 58 in series therewith to prevent large voltages of the amplifier 12 from back-biasing either switch when the other is driving the deflection system. A final required modification is control over the commutation of the main switches by provision of an additional input signal line 60, 62 to the respective AND circuits 36, –36. These are controlled by signals $S_1$ and $S_3$ which are provided by the control signal generator 54 in such a fashion that for current $I_C$ of zero or positive, $S_1$ allows the AND circuit 36 to operate as described with respect to FIG. 3 so that the switch SW1 will commutate, even when zero current is required to be delivered by the module 16 to the deflection amplifier 10 (situation (c), FIG. 1 and FIG. 2). The time of occurrence of the control signals $S_1$–$S_6$ is illustrated at the bottom of FIG. 2. Consider the three situations in the order shown in FIG. 2 (b, c, a), assuming that maximum negative current is required first, and that characters are generated requiring increasingly positive current (rather than a smooth sweep as shown in illustration (a) of FIG. 2). At first, signals $S_3$, $S_4$ and $S_6$ are present so that $Q_6$ is conductive allowing negative current ($-I_C$) to flow upwardly from the deflection system 10 through $Q_6$, to the left through the large inductance $L_{CC}$ ($+I_{CC}$) up through the rectifier 58 and switch −SW2 to the −$V_{CC}$ supply. This current is regulated as described with respect to FIG. 3 by the combined action of the AND circuit 36 periodically being turned off by the clock signals on the line −38, which causes a large current to flow through the sensing resistor −$R_{SC}$ so that the comparator −34 initially does not provide a signal on the line −44, but after decay of that current, will provide the signal on the line −44 and once again turn on the AND circuit −36. During this period of time, the signal on the line 62 is present since $S_3$ is being generated as indicated at the bottom of FIG. 2. During the first half of situation (c), the difference (compared with situation (b)) is that $Q_6$ has been turned off by the absence of $S_6$ but $Q_2$ has been turned on by the appearance of signal $S_2$. The left half of FIG. 4 continues to function as before, but instead of current passing upwardly through $Q_6$ from ground, it now passes upwardly through $Q_2$, whereby the negative current portion utilizes the decay current leg of the positive portion to complete its path during the first part of situation (c), when little or no current is to be supplied to the deflection assembly 10. However, as soon as the input voltage swings slightly positive during the second half of situation (c) in FIG. 2, the signal $S_3$ disappears so that there is no longer an input on the line 62 to the AND circuit −36, and the main negative switch −SW2 can no longer commutate. On the other hand, the signal $S_1$ does appear on the line 60 so that the AND circuit 36 will cause the switch SW1 to begin commutation. Since both $S_2$ and $S_4$ are still present, $Q_2$ and $Q_4$ are still conducting. $Q_2$ provides the regular return path for decay current through the sense resistor $R_{SC}$ when switch SW1 is turned off, and $Q_4$ provides conduction of current from the large inductor $L_{CC}$ to ground during the periods of time the switch SW1 is conducting with $Q_5$ off. When a desired deflection current goes above plus one third of the maximum positive deflection current (situation (a) in FIG. 1 and FIG. 2), the control signal $S_5$ turns on transistor $Q_5$ so that positive current $I_{CC}$ can flow from the left side of the large inductance $L_{CC}$ downward as seen in FIG. 4 ($I_C$) to the deflection assembly 10. In addition, signal $S_4$ disappears so that $Q_4$ no longer provides a path to ground and therefore will not shunt the deflection assembly 10 insofar as $I_C$ is concerned.

The manner of developing the control signals illustrated at the bottom of FIGS. 2 and 4 is not important to the present invention, but may readily be achieved by Schmidt triggers 60–62 as illustrated in the bottom right of FIG. 4. The generation of the control signals $S_1$–$S_6$ is preferably accomplished with a certain amount of hysteresis. Referring to FIG. 2, this means that changing the signals when switching from situation (b) to situation (c) would be done in response to input voltages $V_{IN}$ which are higher than the input voltages which would cause switching from situation (c) to situation (b). This is in order to prevent changes in operation in the circuitry of FIG. 4 many times during the generation of a character near the transition of situation (b) to situation (c) or near the transition of situation (c) to situation (a). Thus, if the maximum character width in the direction of sweep being controlled by the yoke 14 (FIG. 4) corresponded to an input voltage of on the order of a tenth of a volt, then on the order of two tenths of a volt of hysteresis would be useful. Thus, the Schmidt triggers 61, 62 in FIG. 4 turn on in response to a voltage which is, for example, two tenths of a volt higher than the voltage required to turn them off. Thus, the Schmidt trigger 61 may have its thresholds adjusted to turn on at 0.34 of a maximum voltage and turn off at 0.32 of the maximum voltage in the positive direction, and the Schmidt trigger 62 may have its thresholds adjusted so as to turn on at 0.34 of the maximum negative voltage and to turn off at 0.32 of the maximum negative voltage. On the other hand, the Schmidt trigger 60 controls the change from the left half of situation (c) to the right half of situation (c), and therefore, operates nominally at zero input voltage. But it is also provided with approximately two tenths of a volt of hysteresis by having its thresholds set, for example, at +0.1 volt and −0.1 volt. the output of the Schmidt trigger 60 comprises the signal $S_1$, the output of the Schmidt trigger 61 comprises the signal $S_5$, and the output of the Schmidt trigger 62 comprises the signal $S_6$. The signals $S_1$, $S_5$ and $S_6$ are inverted by inverters 64–66 to respectively provided the signals $S_3$, $S_4$, and $S_2$. Thus, the control signal generator 54 shown at the bottom of FIG. 4 provides the control signals $S_1$–$S_6$ in the time frames shown at the bottom of FIG. 2, but with a slight hysteresis to prevent generation of a given character from causing multiple switchings of the circuitry.

Considering again the invention in its simpler form, as is illustrated in FIG. 3, a current generator in accordance herewith comprises essentially a power supply (+$V_{CC}$) connected through a switch (SW1) to a relatively large inductance ($L_{CC}$), the current through which may be applied to a load (34). The current is regulated by sensing the decay of current in a unilateral return path ($R_{SC}$, 46) which is conductive only when the switch is nonconductive. When the current in this unilateral path decays to a certain point, the switch is again turned on. In accordance with further aspects of the invention, the sensing of current and control of the turn-on and turn-off of the switch is in response to an AND circuit (36) which is blocked on a cyclic basis by a commutating clock signal (38) and is again turned on by a circuit (42) which compares the voltage developed through a resistor ($R_{SC}$) in the unilateral path against a reference voltage (−$V_{REF}$); the sense and polarity of the comparison is achieved in such a manner that the comparator continues to provide an output signal when there is no voltage across the sensing resistor ($R_{SC}$), and in fact will produce an output signal except when the switch is first turned off and maximum initial current is fed through the sensing resistor ($R_{SC}$).

In accordance with other aspects of the invention as illustrated in the more advanced embodiment shown in FIG. 4, there are provided reciprocal versions of the current generator just described, one working with respect to a positive voltage supply so as to supply current into a load, and one working with respect to a negative voltage supply so as to draw current from a load. In addition to the foregoing, the more complex embodiment of FIG. 4 includes switching transistors ($Q_5$, $Q_6$) to isolate the current source from the load when no current is to flow to or from the load, and each of the reciprocal current sources utilizes the unilateral return path of the other as a return to ground when the switches are opened and no current is flowing through the load, thereby to maintan current through the large inductance ($L_{CC}$) at all times. In addition, control signals are provided, with hysteresis, so as to cause each of the main switches to operate in a controlled fashion only when that switch is desired to provide regulated current to the large inductance ($L_{CC}$), to provide return paths for the other source, and to block its own return path so as not to shunt out the load when it is not providing current to the load or being used as a return path for the other source (when current is not being provided to the load by either source).

In the embodiment of FIG. 4, the feedback (from $R_S$ through $R_F$) of the amplifier 12 causes the current $I_A$ to be whatever is required to make up the difference between the desired delfection current $I_Y$ and the current $I_C$ provided by the module 16. This feedback is external, but internal feedback, such as that which results when current is added into the emitter node of a compound emitter amplifier (such as a Darlington) also provides requisite feedback for correct total current. Thus, a Darlington or other internal feedback amplifier stage may be used, without external feedback, if desired.

Since the current of the source 16 is maintained at all times, it can be switched in and out and reversed very quickly, thereby permitting use for energy conservation in high speed applications, such as high video-rate stroke-write displays Although the invention has been shown and described with respect to preferred emmbodiments thereof, it should be understood by those skilled in the art that the foregoing and various other changes, omissions and additions thereto may be made therein, without departing from the spirit and the scope of the invention.

Having thus described typical embodiments of our invention, that which we claim as new and desire to secure by Letters Patent is:

1. An energy conservative current system comprising:
   a current load and an amplifier driving said current load with negative feedback from said current load in response to input signals indicative of the current desired in said load;
   a source of substantially constant current of a magnitude of current to be delivered to said current load; and
   means responsive to input signals applied to said amplifier of either polarity in excess of given magnitude for connecting said current source in a corresponding polarity to said current load, the current in said current load being the summation of the current from said constant current source and the current from said negative feedback amplifier, said negative feedback amplifier being responsive to the current through said current load to provide a current equal to the difference between the current supplied by said constant current source and the current desired in said load as indicated by the amplifier input signals, said means also being responsive to the absence of input signals to said amplifier in excess of said given magnitude for disconnecting said current source from said amplifier.

2. A current source comprising:
   a DC power supply, a large inductance, and a switch connected between said power supply and said inductance;
   a unilaterally conducting decay current path connected in parallel with said switch and said power supply and poled to conduct current to said inductance in the same direction as said power supply;
   means for sensing the level of current in said unilateral path and providing a turn-on signal when said level of current is below a given level; and
   switch control means responsive to said current sensing means for shutting off said switch on a periodic basis, and for turning said switch back on in response to said turn-on signal, whereby the average current through said large inductance is determined by the duty cycle of said switch as a function of said given level of current.

3. A current source according to claim 2 wherein;
   said unilateral path includes a resistor; and
   said means providing a turn-on signal includes a reference voltage and a comparator which provides said turn-on signal in response to the voltage across said resistor being closer to zero than said reference voltage.

4. A current source according to claim 3 wherein said switch control means comprises clock means for providing a repetitive signal on a periodic basis, said signal designating a logical one over substantially all of each cycle, and designating a logical zero over a small portion of each cycle, and an AND circuit responsive to said clock means and to said comparator.

5. An energy conservative current source module adapted to supply regulated average currents to a current load, comprising:
   a positive DC power supply and a negative DC power supply, each of said power supplies referenced to ground;
   an inductor;
   electronic switch means connected between said positive DC power supply and one end of said inductor;
   second electronic switch means connected from said negative DC power supply to the other end of said inductor;
   means for selectively conducting current from ground to said first end of said inductor and for providing a signal indication of the magnitude of current conducted thereby;
   means for selectively conducting current from said second end of said inductor to ground and for providing a signal indication of the magnitude of current conducted thereby;
   a current output adapted for connection to a current load;
   selectively operable means for connecting said current output to said first end of said inductor or to said other end of said inductor or for leaving said current output unconnected;
   a pair of selectively operable switch control means, one for each of said electronic switches, each responsive to the corresponding current magnitude indicating signal and, when operable, for commutating the operation of the related one of said electronic switches by periodically disabling said switch on a cyclic basis and again turning on said switch in response to a signal indicating a current of less than a given magnitude in the related one of said selectively conductive means; and
   means for selectively operating all of said selectively operable means such that current is provided through said inductor in the same direction at all times from either power supply through its related switch through one of said output connections and said load, or from either power supply through its related switch through the selectively conductive means relating to the other power supply.

* * * * *

UNITED STATES PATENT OFFICE
CERTIFICATE OF CORRECTION

PATENT NO. : 3,935,529
DATED : January 27, 1976
INVENTOR(S) : Michael H. Kalmanash and Glenn C. Waehner It is certified that error appears in the above-identified patent and that said Letters Patent are hereby corrected as shown below:

Column 2, line 8, change "Accordance" to --According--

Column 3, line 44, change "provided" to --provide--

Column 4, line 65, change "$V_{REF}$" to -- $-V_{REF}$ --

Column 5, line 40, change "convetional" to --conventional--

Column 6, line 31, change "-SW2" to --SW2--

Column 6, line 32, change "but" to --But--

Column 7, line 3, change "36" to -- -36 --

Column 7, line 27, change "-SW2" to --SW2--

Column 8, line 12, change "the output" to --The output--

Column 8, line 17, change "provided" to --provide--

Column 9, line 8, change "delfection" to --deflection--

Column 9, claim 1, line 39, after "tude" insert --less than the maximum magnitude--

Signed and Sealed this twenty-seventh Day of April 1976

[SEAL]

Attest:

RUTH C. MASON
Attesting Officer

C. MARSHALL DANN
Commissioner of Patents and Trademarks